US011379052B2

(12) United States Patent
Wakuda (10) Patent No.: US 11,379,052 B2
(45) Date of Patent: Jul. 5, 2022

(54) INPUT DEVICE (71) Applicant: ALPS ALPINE CO., LTD., Tokyo (JP)

(72) Inventor: Hiroshi Wakuda, Miyagi (JP)

(73) Assignee: ALPS ALPINE CO., LTD., Tokyo (JP)

( * ) Notice: Subject to any disclaimer, the term of this patent is extended or adjusted under 35 U.S.C. 154(b) by 0 days.

(21) Appl. No.: 17/241,338

(22) Filed: Apr. 27, 2021

(65) Prior Publication Data
US 2021/0247853 A1    Aug. 12, 2021

Related U.S. Application Data (63) Continuation of application No. PCT/JP2019/041977, filed on Oct. 25, 2019.

(30) Foreign Application Priority Data

Nov. 30, 2018    (JP) .............................. JP2018-225703

(51) Int. Cl.
*G06F 3/0338* (2013.01)
*G06F 3/0354* (2013.01)
(Continued)

(52) U.S. Cl.
CPC ............ *G06F 3/0338* (2013.01); *G06F 3/016* (2013.01); *G06F 3/03547* (2013.01); *H03K 17/964* (2013.01); *H03K 2217/96062* (2013.01)

(58) Field of Classification Search
CPC .... G06F 3/016; G06F 3/0338; G06F 3/03547; G06F 3/041; H03K 17/964; H03K 2217/96062
See application file for complete search history.

(56) References Cited

U.S. PATENT DOCUMENTS 10,345,910 B1 *    7/2019  Khoshkava  ............ H01L 41/09
2002/0144886 A1    10/2002 Engelmann et al.
(Continued)

FOREIGN PATENT DOCUMENTS

| JP | 2002-373540 | 12/2002 |
|---|---|---|
| JP | 2003-177857 | 6/2003 |

(Continued)

OTHER PUBLICATIONS

International Search Report for PCT/JP2019/041977 dated Dec. 24, 2019.

*Primary Examiner* — Afroza Chowdhury
(74) *Attorney, Agent, or Firm* — IPUSA, PLLC (57) ABSTRACT

An input device includes a base, an operation panel member, positioned in a first direction when viewed from the base, including an input operation surface, and configured to detect coordinates of an operating position on the input operation surface, an actuator, fixed to the base, and configured to vibrate the operation panel member, N elastic support members, arranged at vertex positions of a polygon shape having N corners and surrounding the actuator when viewed in the first direction, and configured to elastically support the operation panel member on the base, where N is an integer greater than or equal to three, and an elastic cushioning member provided between the actuator and the operation panel member. A spring constant of a combined spring in which the actuator and the elastic cushioning member are coupled in series is aligned to spring constants of the N elastic support members.

13 Claims, 11 Drawing Sheets

(51) Int. Cl.
    *G06F 3/01*     (2006.01)
    *H03K 17/96*     (2006.01)

(56) References Cited

U.S. PATENT DOCUMENTS

| | | | |
|---|---|---|---|
| 2003/0076298 A1 | 4/2003 | Rosenberg | |
| 2017/0256144 A1* | 9/2017 | Khoshkava | G06F 3/0488 |
| 2018/0329493 A1* | 11/2018 | Khoshkava | H01L 41/09 |
| 2019/0020288 A1 | 1/2019 | Makinen et al. | |

FOREIGN PATENT DOCUMENTS

| | | |
|---|---|---|
| JP | 2005-514681 | 5/2005 |
| JP | 2008-123429 | 5/2008 |
| JP | 2016-151777 | 8/2016 |
| WO | 2018/172623 | 9/2018 |

* cited by examiner

INPUT DEVICE

CROSS REFERENCE TO RELATED APPLICATIONS

This application is a continuation application of International Application No. PCT/JP2019/041977 filed on Oct. 25, 2019 and designated the U.S., which is based upon and claims priority to Japanese Patent Application No. 2018-225703, filed on Nov. 30, 2018, the entire contents of each of which are hereby incorporated by reference.

BACKGROUND

1. Technical Field

The present disclosure relates to input devices.

2. Description of the Related Art

In recent years, input devices, such as touchpads, which enable an input operation by a touch to an input operation surface, are becoming popular. When such input devices are operated, an operator cannot feel the operation, such as that felt when a switching device, a variable resistor, or the like is operated. Hence, input devices have been proposed, which provide a vibration feedback by vibrating the input operation surface when operated, so that the operation can be felt spuriously.

For example, input devices have been proposed, which provide an elastic part between a touch sensor and an actuator, and cause the elastic part to buckle if the elastic part is pressed down with a force greater than or equal to a predetermined value, for the purposes of presenting a feeling of a click upon a pressing down operation even if there is a limit to a range with which the operation surface can be pressed down.

However, in the input devices of the related art, inconsistencies are introduced in the feeling of a stroke on the input operation surface.

Related Art may include Japanese Laid-Open Patent Publication No. 2016-151777, Japanese Laid-Open Patent Publication No. 2003-177857, and Japanese Laid-Open Patent Publication No. 2008-123429, for example.

SUMMARY

According to one aspect of the present disclosure, an input device includes a base; an operation panel member, positioned in a first direction when viewed from the base, including an input operation surface, and configured to detect coordinates of an operating position on the input operation surface; an actuator, fixed to the base, and configured to vibrate the operation panel member; N elastic support members, arranged at vertex positions of a polygon shape having N (N is an integer greater than or equal to three) corners and surrounding the actuator when viewed in the first direction, and configured to elastically support the operation panel member on the base; and an elastic cushioning member provided between the actuator and the operation panel member, wherein a spring constant of a combined spring in which the actuator and the elastic cushioning member are coupled in series is aligned to spring constants of the N elastic support members.

Other objects and further features of the present invention will be apparent from the following detailed description when read in conjunction with the accompanying drawings.

DETAILED DESCRIPTION

Embodiments of the present disclosure will be specifically described in the following, by referring to the drawings. In this specification and the drawings, those constituent elements that have substantially the same functions or configurations are designated by the same reference numerals, and a repeated description thereof may be omitted.

According to one aspect of the present disclosure, inconsistencies introduced in the feeling of a stroke on an input operation surface of an input device are reduced.

Figure 1:
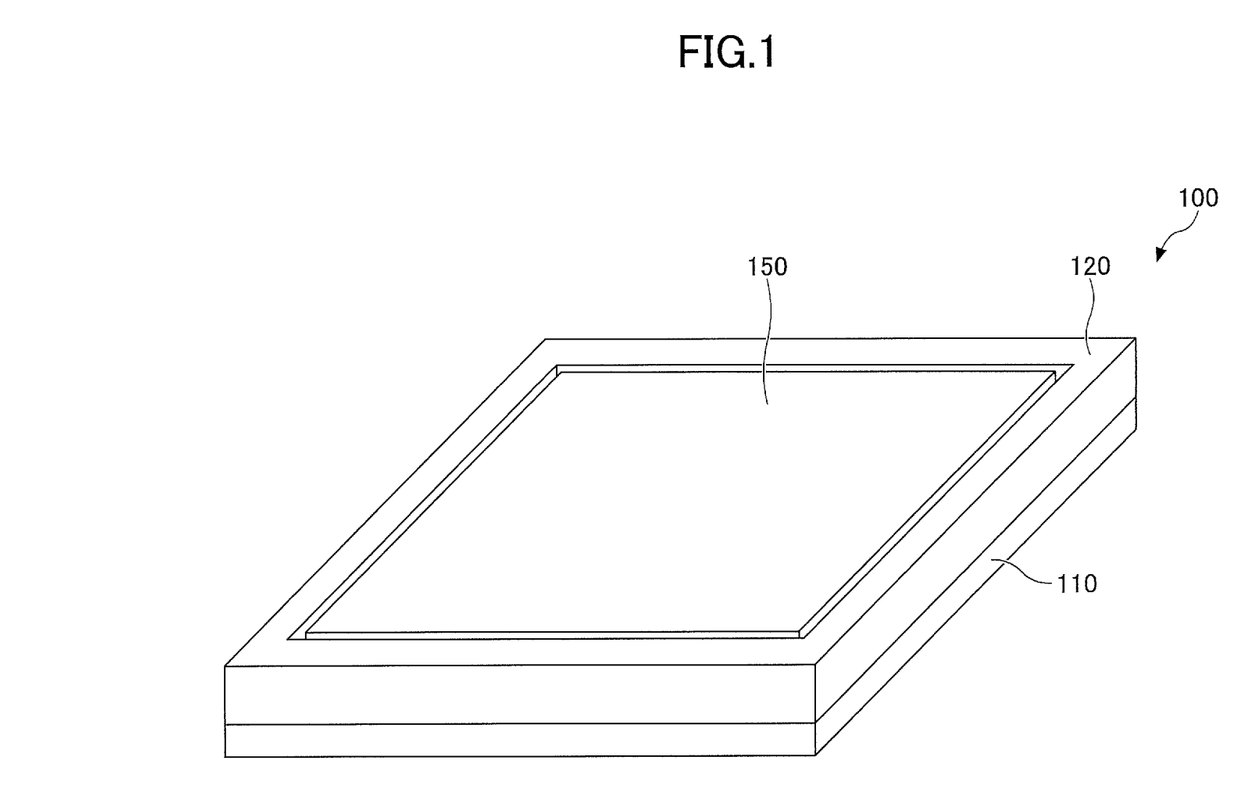
FIG. 1 is a perspective view illustrating a configuration of an input device according to one embodiment.
Figure 2:
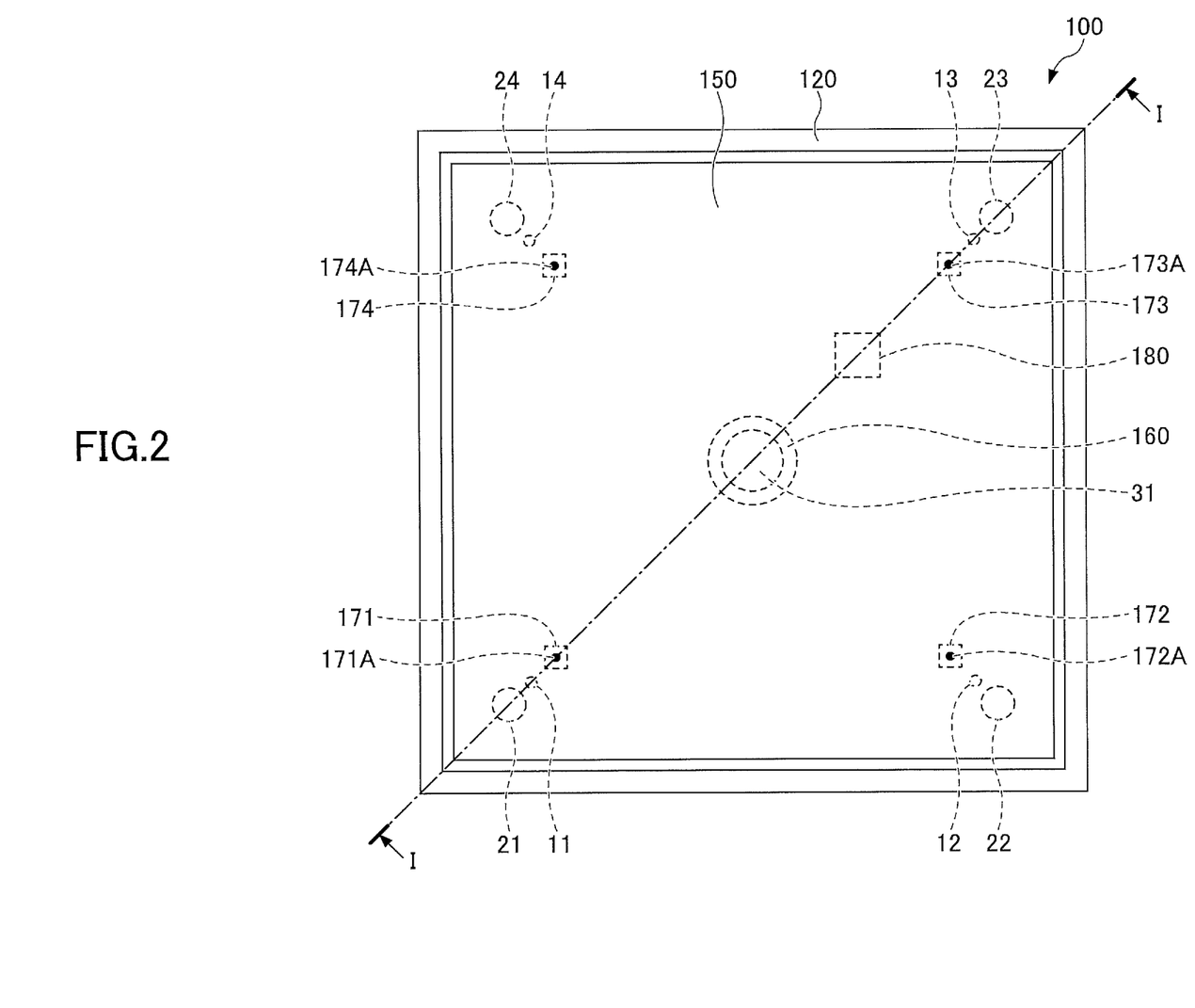
FIG. 2 is a top view illustrating the configuration of the input device according to one embodiment.
Figure 3:
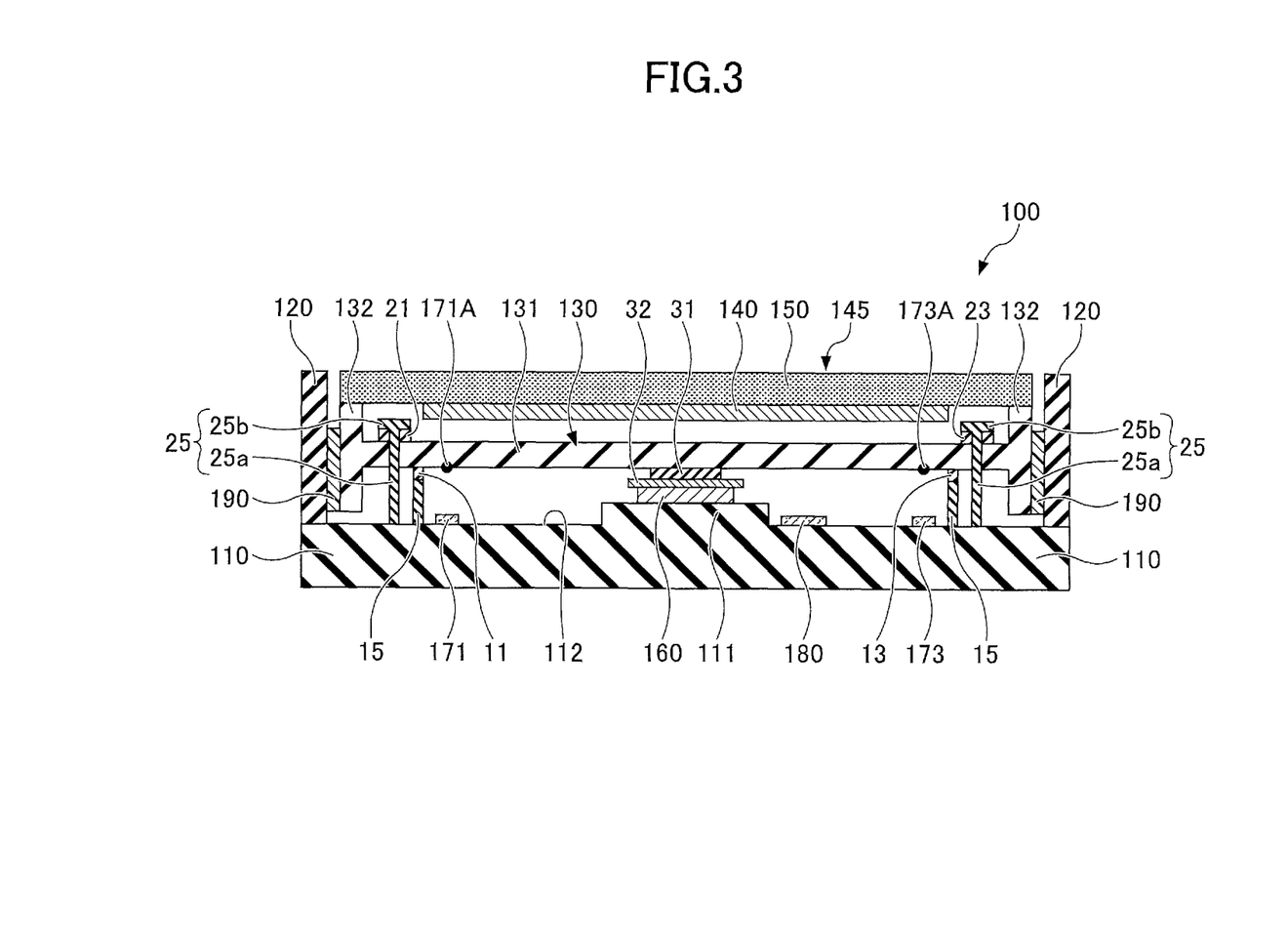
FIG. 3 is a cross sectional view illustrating the configuration of the input device according to one embodiment.

One embodiment relates to an input device having a piezoelectric actuator as an actuator. FIG. 1 is a perspective view illustrating a configuration of then input device according to one embodiment, FIG. 2 is a top view illustrating the configuration of the input device according to one embodiment, and FIG. 3 is a cross sectional view illustrating the configuration of the input device according to one embodiment. FIG. 3 corresponds to the cross sectional view along a line I-I in FIG. 2.

As illustrated in FIG. 1 through FIG. 3, an input device 100 according to one embodiment includes a fixing base 110, a bezel 120 fixed on an edge of the fixing base 110, and a decorative panel 150 arranged at an inner position relative to the bezel 120. A touch sensor 140 is provided at a position closer to the fixing base 110 than the decorative panel 150 is, and a movable base 130 is provided at a position closer to the fixing base 110 than the touch sensor 140 is. The movable base 130 includes a flat plate 131 arranged parallel to the touch sensor 140 and the decorative panel 150, and a wall 132 provided on an edge of the flat plate 131 and extending along an inner surface of the bezel 120. A slide guide 190 is provided between the wall 132 and the bezel 120. The fixing base 110 has a protrusion 111 at a center thereon in a plan view, and an actuator 160 that is fixed on the protrusion 111. The actuator 160 is a piezoelectric actuator, for example. The touch sensor 140 is an example of a touchpad, the movable base 130 is an example of a holding portion for holding the touch sensor 140, and the movable base 130, the touch sensor 140, and decorative panel 150 are included in an operation panel member 145. The fixing base 110 is an example of a base. The actuator 160 vibrates the operation panel member 145.

A plurality of reflection type photo interrupters 171, 172, 173, and 174 are provided on the fixing base 110. The photo interrupters 171 through 174 can irradiate light to points 171A through 174A on the flat plate 131 located above, and receive light reflected by the flat plate 131, thereby detecting distances to the portions of the flat plate 131 irradiated with the light. For example, the photo interrupters 171 through 174 are arranged at inner positions relative to four corners of the touch sensor 140 in the plan view. Accordingly, the photo interrupters 171 through 174 form at least one triangle in the plan view. The photo interrupters 171 through 174 are examples of first through fourth sensors (photo sensors), the first through fourth sensors (photo sensors) are examples of a sensing unit, and a surface 112 of the fixing base 110 provided with the photo interrupters 171 through 174 is an example of a reference surface. The reference surface is separated from the operation panel member 145. In this embodiment, it is assumed that the reference surface is a reference plane including an X-axis and a Y-axis, and a direction perpendicular to the reference plane is a Z-axis direction (first direction).

Rubbers 11, 12, 13, and 14 are provided on a surface of the flat plate 131 that is closer to the fixing base 110 in the plan view. In addition, rubbers 21, 22, 23, and 24 are provided on a surface of the flat plate 131 that is closer to the decorative panel 150 in the plan view. For example, rubbers 11 and 21 are provided at the corner where the photo interrupter 171 is provided, and the rubbers 12 and 22 are provided at the corner where the photo interrupter 172 is provided. For example, the rubbers 13 and 23 are provided at the corner where the photo interrupter 173 is provided, and the rubbers 14 and 24 are provided at the corner where the photo interrupter 174 is provided.

A rubber support member 15 is provided between the rubbers 11 through 14 and the fixing base 110. The rubber support member 15 is fixed to the fixing base 110. The rubbers 11 through 14 are compressed and sandwiched between the rubber support member 15 and the flat plate 131. Accordingly, the rubbers 11 through 14 urge the movable base 130 in a direction so as to separate from the fixing base 110.

Rubber support members 25 that are provided include supports 25a, and supports 25b provided at upper ends of the supports 25a and compressing and sandwiching the rubbers 21 through 24 between the supports 25b and the flat plate 131. The supports 25a are fixed to the fixing base 110. Hence, the rubbers 21 through 24 urge the movable base 130 in a direction toward the fixing base 110.

For example, the rubbers 11 through 14 are respectively formed of the same material and respectively have the same shape, and the rubbers 21 through 24 are respectively formed of the same material and respectively have the same shape. Accordingly, a spring constant $k_{31}$ of a combined spring formed by the rubbers 11 and 21 coupled in series, a spring constant $k_{32}$ of a combined spring formed by the rubbers 12 and 22 coupled in series, a spring constant $k_{33}$ of a combined spring formed by the rubbers 13 and 23 coupled in series, and a spring constant $k_{34}$ of a combined spring formed by the rubbers 14 and 24 coupled in series, are respectively the same. If a sum of the spring constants of these four combined springs coupled in parallel is denoted by $k_3$, relationships of the following formulas (1) and (2) stand.

$$k_{31}=k_{32}=k_{33}=k_{34} \qquad (1)$$

$$k_3=k_{31}+k_{32}+k_{33}+k_{34} \qquad (2)$$

The combined spring of the rubbers 11 and 21 coupled in series, the combined spring of the rubbers 12 and 22 coupled in series, the combined spring of the rubbers 13 and 23 coupled in series, and the combined spring of the rubbers 14 and 24 coupled in series, respectively are an example of an elastic support member. In other words, this embodiment includes four elastic support members. These four elastic support members are arranged at vertexes of a rectangular shape surrounding the actuator 160 when viewed in the Z-axis direction (first direction).

A rubber 31 is provided at a portion of the flat plate 131 opposing the actuator 160, and a rigid plate 32 is provided between the rubber 31 and the actuator 160. The rigid plate 32 is fixed to a surface of the actuator 160 that is closer to the rubber 31, and an amount of elastic deformation of the rigid plate 32 is such an amount that is negligible with respect to an amount of elastic deformation of the actuator 160 and the rubber 31. Accordingly, if a spring constant of the actuator 160 in a thickness direction is denoted by $k_1$, and a spring constant of the rubber 31 in the thickness direction is denoted by $k_2$, a spring constant $k_s$ of a combined spring of the actuator 160 and the rubber 31 coupled in series between the flat plate 131 and the protrusion 111, can be expressed by $(k_1 \times k_2)/(k_1+k_2)$. For this reason, the spring constant $k_s$ of the combined spring becomes smaller than the spring constant $k_1$ of the actuator 160. The rubber 31 is an example of an elastic cushioning member.

Figure 4:
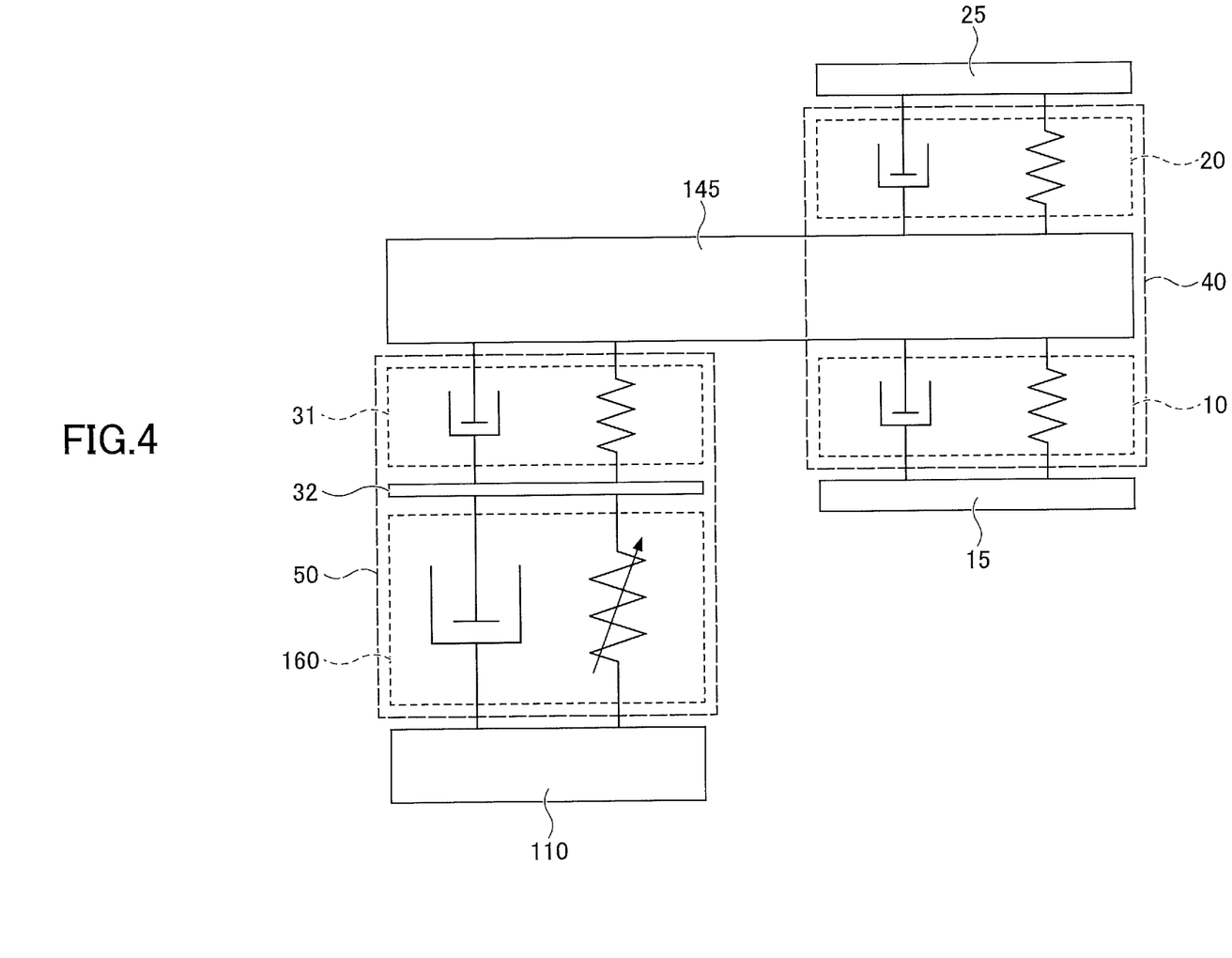
FIG. 4 is a diagram illustrating a kinetic model of an operation panel member of the input device according to one embodiment.

FIG. 4 is a diagram illustrating a kinetic model of motion of the operation panel member 145 of the input device 100. In this kinetic model, a combined spring 40 is formed by coupling a combined spring 10 of rubbers 11 through 14 coupled in parallel, and a combined spring 20 of rubbers 21 through 24 coupled in parallel, in series. A spring constant of the combined spring 40 is a combined spring constant $k_3$ which is a sum of the spring constants $k_{31}$ through $k_{34}$.

In this embodiment, because the rubber 31 is provided, the spring constant $k_s$ of a combined spring 50 in which the actuator 160 and the rubber 31 are coupled in series, is less than the spring constant $k_1$ of the actuator 160. Because the spring constant $k_s$ of the combined spring 50 is less than the spring constant $k_1$ of the actuator 160, the operation panel member 145 more easily moves toward the fixing base 110 near the actuator 160, when compared to a case where the rubber 31 is not provided.

Further, in this embodiment, the spring constant $k_s$ of the combined spring 50 is aligned to (or is adjusted to align to) the spring constants $k_{31}$, $k_{32}$, $k_{33}$, and $k_{34}$. However, the spring constant $k_s$ of the combined spring 50 does not necessarily have to perfectly match the spring constants $k_{31}$, $k_{32}$, $k_{33}$, and $k_{34}$, and the spring constant $k_s$ of the combined spring 50 may approximately match the spring constants $k_{31}$, $k_{32}$, $k_{33}$, and $k_{34}$. For example, the spring constant $k_s$ of the combined spring 50 is preferably greater than or equal to an average value $k_3/4$ of the spring constants $k_{31}$, $k_{32}$, $k_{33}$, and $k_{34}$. In other words, the following formula (3) preferably stands.

$$k_3/4 <= k_s=(k_1 \times k_2)/(k_1+k_2) \qquad (3)$$

If the spring constant $k_s$ is too small, the vibration generated by the actuator 160 is absorbed by the rubber 31, and it is difficult to transmit the vibration to the operation panel member 145. If the spring constant $k_s$ is greater than or equal to the average value $k_3/4$, the vibration generated by the actuator 160 can be appropriately transmitted to the operation panel member 145.

In addition, the spring constant $k_s$ of the combined spring 50 is preferably less than or equal to the spring constant $k_3$ of the combined spring 40. In other words, the following formula (4) preferably stands.

$$k_s = (k_1 \times k_2)/(k_1+k_2) <= k_3 \quad (4)$$

When the spring constant $k_s$ of the combined spring 50 exceeds the spring constant $k_3$ of the combined spring 40, the operation panel member 145 uneasily moves toward the fixing base 110 near the actuator 160, and inconsistencies are easily generated in a feeling of a stroke. From a viewpoint of further reducing the inconsistencies in the feeling of the stroke, the spring constant $k_s$ of the combined spring 50 is more preferably less than or equal to ½ the spring constant $k_3$ of the combined spring 40.

Moreover, a signal processor 180 is provided on the fixing base 110. The signal processor 180 provides a haptic feedback to a user by driving the actuator 160 in response to an operation of the touch sensor 140, by a process which will be described below. In other words, the actuator 160 vibrates the operation panel member 145 including the movable base 130, the touch sensor 140, and the decorative panel 150, thereby providing the haptic feedback to the user through the operation panel member 145. The signal processor 180 is a semiconductor chip, for example. Although the signal processor 180 is provided on the fixing base 110 in this embodiment, the position where the signal processor 180 is provided is not particularly limited, and the signal processor 180 may be provided at a position between the touch sensor 140 and the movable base 130, for example, or the like. The signal processor 180 is an example of a controller.

In one example of the operation of the input device 100 which is configured in this manner, when the touch sensor 140 is operated, the actuator 160 vibrates in a direction perpendicular to an input operation surface of the touch sensor 140 according to an operating position and an operating load. The user can recognize how the operation performed with respect to the input device 100 is reflected, by feeling the vibration of the input operation surface, without monitoring a display device provided on the input device 100 or the like. For example, in a case where the input device 100 is provided in a center console for various switches in an automobile, a driver can recognize how the operation made by the driver is reflected, by feeling the vibration of the actuator 160, without shifting a line of sight towards the input device 100. The actuator 160 is not limited to the example described above, and may be configured to generate the vibration in an arbitrary direction.

Next, a basic principle of a load detection process to detect the load applied to the touch sensor 140 in this embodiment, will be described. In this embodiment, a formula of a plane for the flat plate 131, that is, the formula of the plane including the points 171A through 174A, is obtained from the distance to the flat plate 131 detected by each of the photo interrupters 171 through 174, and coordinates of the operating position detected by the touch sensor 140, thereby obtaining a displacement at the operating position.

Figure 5:
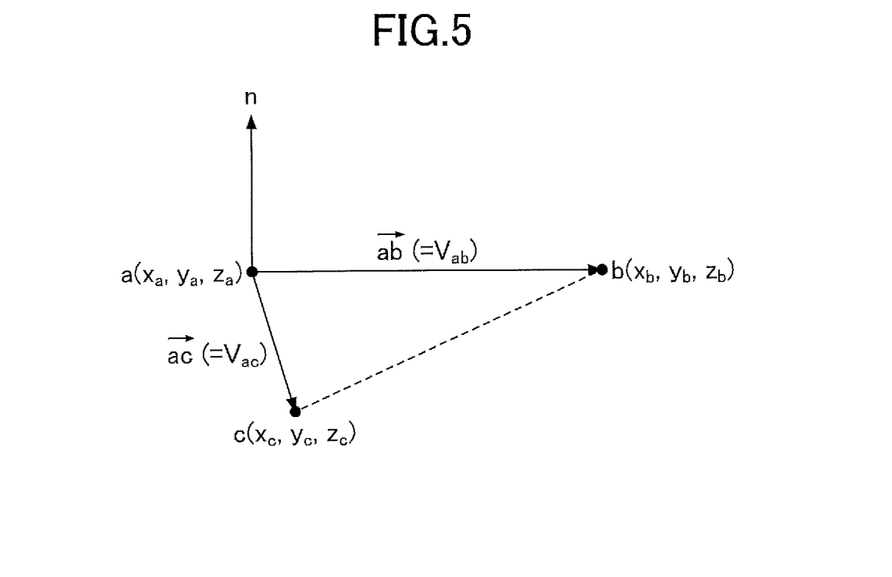
FIG. 5 is a diagram illustrating arbitrary XYZ coordinate system.

An equation of a plane will now be described. FIG. 5 is a diagram illustrating an arbitrary XYZ coordinate system.

It is assumed that three points $a(x_a, y_a, z_a)$, $b(x_b, y_b, z_b)$, and $c(x_c, y_c, z_c)$ are included in the XYZ coordinate system. In this case, a component $(x_1, y_1, z_1)$ of a vector ac (hereafter referred to as "$V_{ac}$") is $(x_c-x_a, y_c-y_a, z_c-z_a)$, and a component $(x_2, y_2, z_2)$ of a vector ab (hereafter referred to as "Vat") is $(x_b-x_a, y_b-y_a, z_b-z_a)$. Accordingly, a vector product $(V_{ac} \times V_{ab})$ of these vectors is $(y_1 z_2 - z_1 y_2, z_1 x_2 - x_1 z_2, x_1 y_2 - y_1 x_2)$. This vector product corresponds to a normal vector to a plane including the points a, b, and c. For this reason, if $(y_1 z_2 - z_1 y_2, z_1 x_2 - x_1 z_2, x_1 y_2 - y_1 x_2)$ is expressed as (p, q, r), the equation of the plane including the points a, b, and c can be expressed by the following formula (5).

$$p(x-x_a) + q(y-y_a) + r(z-z_a) = 0 \quad (5)$$

Figure 6:
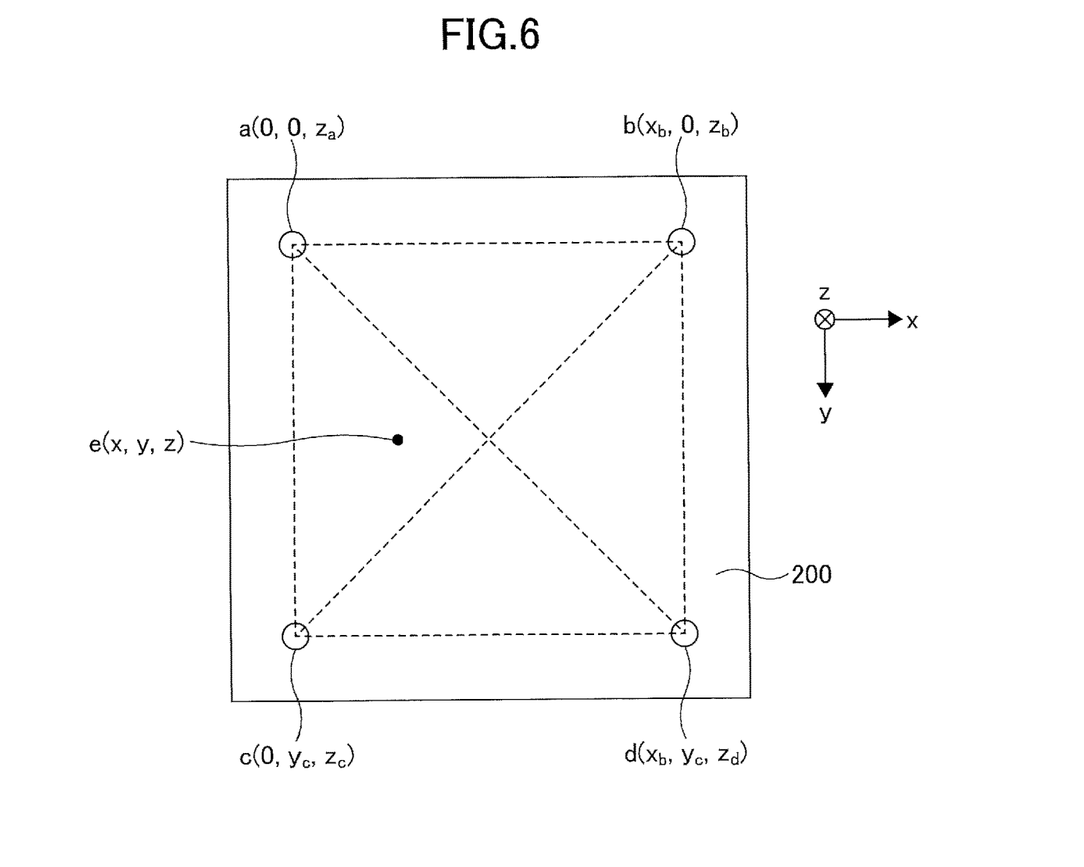
FIG. 6 is a diagram illustrating positional relationships in the XYZ orthogonal coordinate system.

The formula (5) is a general formula, but may be simplified by using an orthogonal coordinate system in which an X coordinate and a Y coordinate of point a in the XYZ coordinate system are 0. FIG. 6 is a diagram illustrating positional relationships in the XYZ orthogonal coordinate system. As illustrated in FIG. 6, in the XYZ orthogonal coordinate system, it is assumed that four points $a(0, 0, z_a)$, $b(x_b, 0, z_b)$, $c(0, y_c, z_c)$, and $d(x_b, y_c, z_d)$ are located on a plane 200. Among these points, the following relationships stand with respect to the coordinates of the points a, b, and c, for example.

$$V_{ac} = (0, y_c, z_c - z_a) = (x_1, y_1, z_1)$$

$$V_{ab} = (x_b, 0, z_b - z_a) = (x_2, y_2, z_2)$$

$$V_{ac} \times V_{ab} = (y_c(z_b - z_a), (z_c - z_a)x_b, -y_c x_b) = (p, q, r)$$

For this reason, the equation of the plane 200 including the first point a, the second point b, and the third point c can be expressed by the following formula (6).

$$y_c(z_b - z_a)x + (z_c - z_a)x_b y - y_c x_b(Z - z_a) = 0 \quad (6)$$

Further, the formula (6) can be expressed as the following formula (7).

$$z = (z_b - z_a)x/x_b + (z_c - z_a)y/y_c + z_a \quad (7)$$

Accordingly, if the Z coordinates of the three points on the arbitrary plane 200 can be located by the first sensor, the second sensor, and the third sensor, and the X coordinate and the Y coordinate of the operating position on the plane 200 can be located by the touchpad, it is possible to locate the Z coordinate of the operating position. Further, the displacement in the Z-axis direction at the operating position can be acquired from a change in the Z coordinate before and after the operation.

In this embodiment, the X coordinate and the Y coordinate of the operating position of the touch sensor 140 can be detected by the touch sensor 140. Accordingly, a contact is made to a point e in FIG. 6, the X coordinate (x) and the Y coordinate (y) of the point e can be acquired from an output of the touch sensor 140. In addition, if the photo interrupters are arranged in correspondence with the points a, b, and c as the first sensor, the second sensor, and the third sensor, and an X coordinate (xb) of the point b and a Y coordinate (yc) of the point c are acquired in advance, a Z coordinate ($z_a$, $z_b$, and $z_c$) of each point can be acquired by detecting the distance to the flat plate 131 from outputs of the photo interrupters, and a Z coordinate (z) of the point e can be acquired from the formula (7).

In other words, if the plane 200 of the touch sensor 140, and the plane including the three photo interrupters arranged in correspondence with the points a, b, and c, are parallel to each other in an initial state, it is possible to acquire the coordinates of the point e after the touch sensor 140 is pressed and the flat plate 131 and the touch sensor 140 tilt. The operation panel member 145 is tiltable with respect to the reference plane according to the load applied to the operating position. Accordingly, it is possible to acquire the displacement in the Z-axis direction at the point e before and after the pressing. Even in a case where the plane 200, and the plane including the three photo interrupters, are not parallel to each other in the initial state, it is possible to acquire the displacement in the Z-axis direction at the point e before and after the pressing, through a similar calculation.

Figure 7A:
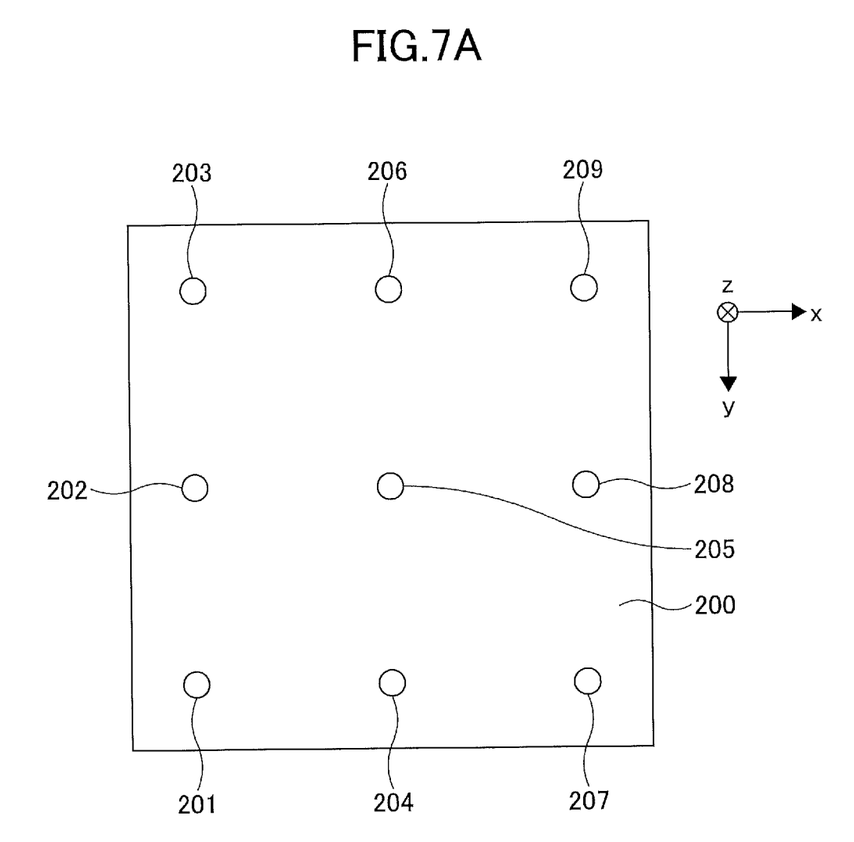
FIG. 7A is a diagram illustrating an example of a relationship between an applied load and a displacement along a Z-axis direction.
Figure 7B:
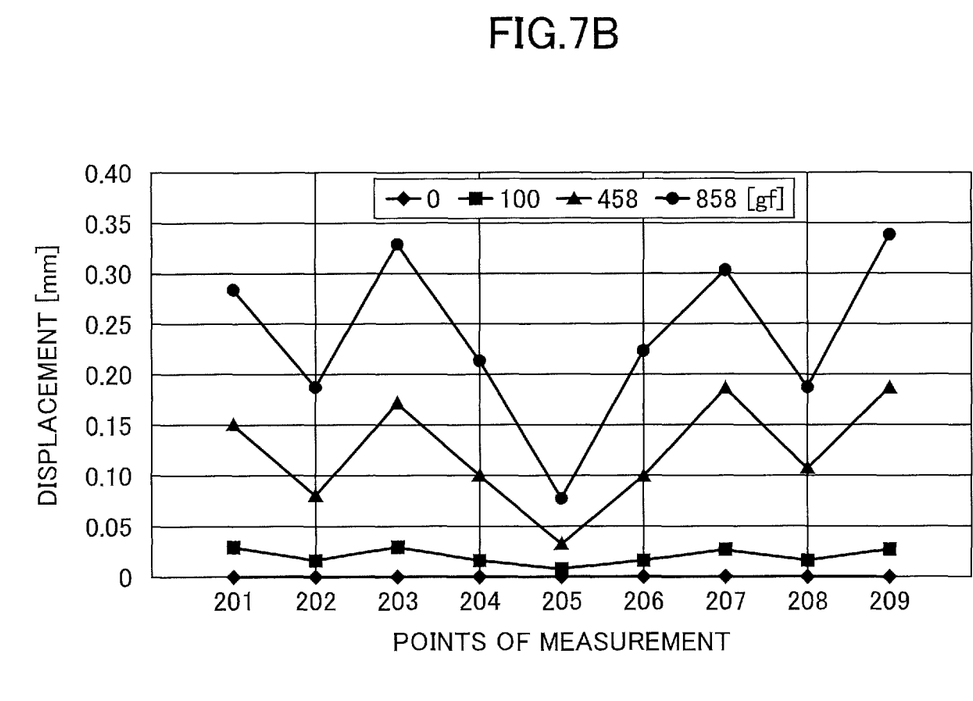
FIG. 7B is a diagram illustrating the example of the relationship between the applied load and the displacement along the Z-axis direction.

Further, by using the displacement in the Z-axis direction at the point e before and after the operation, it is possible to determine whether or not the load applied to the point e exceeds a predetermined reference value, and control the haptic feedback based on a result of this determination. In other words, a relationship between the load applied at a plurality of positions on the plane 200 and the displacement in the Z-axis direction is obtained in advance, a determination is made to determine whether or not the displacement in the Z-axis direction acquired by the above described method exceeds a threshold value corresponding to the reference value of the load, and the haptic feedback is controlled. FIG. 7A and FIG. 7B are diagrams illustrating an example of the relationship between the applied load and the displacement in the Z-axis direction. FIG. 7A illustrates positions of nine points of measurement, and FIG. 7B illustrates the displacement at each point of measurement.

In this example, as illustrated in FIG. 7A, it is assumed that operations are performed with loads of 0 gf (0 N), 100 gf (0.98 N), 458 gf (4.5 N), and 858 gf (8.4 N) at nine points 201, 202, 203, 204, 205, 206, 207, 208, and 209 of measurement arranged in a grid-like pattern, as illustrated in FIG. 7B. It is also assumed that 458 gf (4.5 N) is the reference value, and the haptic feedback is performed when the load exceeding 458 gf (4.5 N) is applied. Because the actuator 160 or the like is provided under the movable base 130, the displacement differs depending on the point of measurement.

If the points 201 through 209 of measurement are operated, the relationship illustrated in FIG. 7A and FIG. 7B can be used to determine whether or not the load exceeds the reference value. In other words, if the displacement in the Z-axis direction calculated according to the formula (7) exceeds the displacement of 458 gf (4.5 N) in FIG. 7B, it can be determined that the load exceeds the reference value. For example, if the point 201 of measurement is operated, 0.15 mm becomes the threshold value of the displacement, and it can be determined that the load reached the reference value which causes the haptic feedback if the displacement exceeds 0.15 mm.

Figure 8:
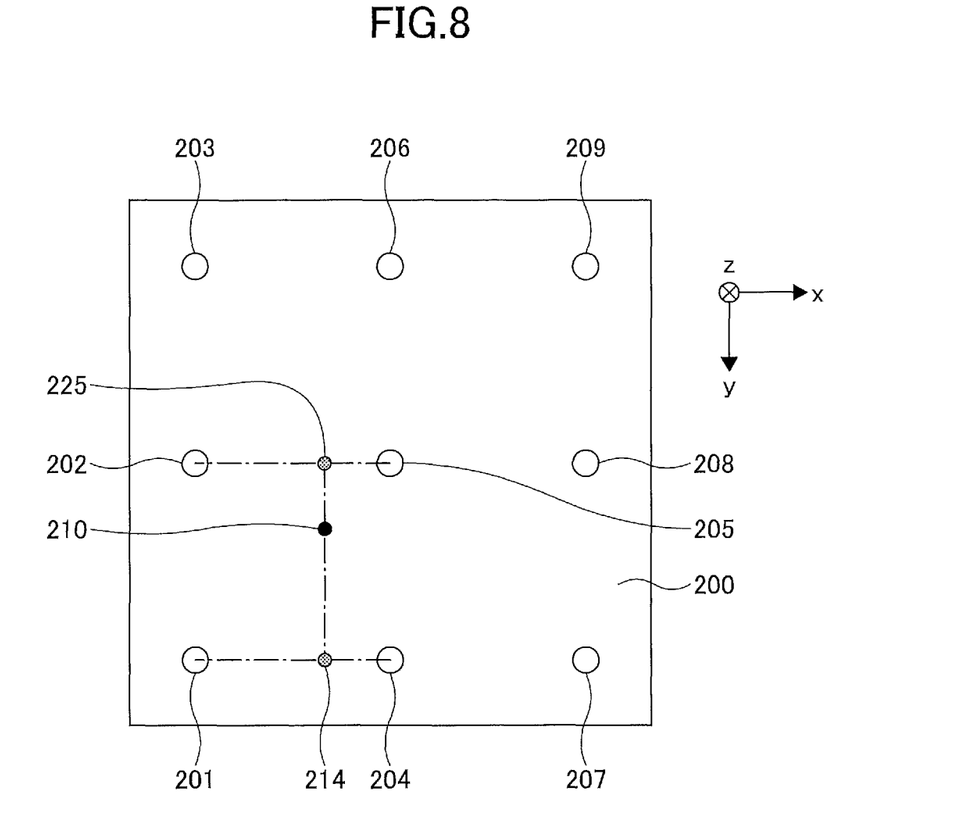
FIG. 8 is a diagram illustrating the positional relationship in one example of a load determination method.
Figure 9A:
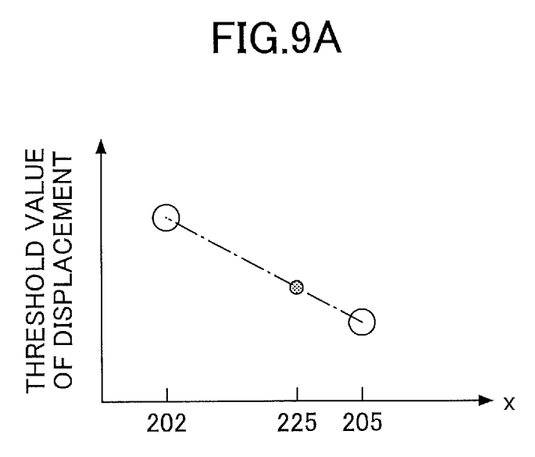
FIG. 9A is a diagram illustrating a linear interpolation in one example of the load determination method.
Figure 9B:
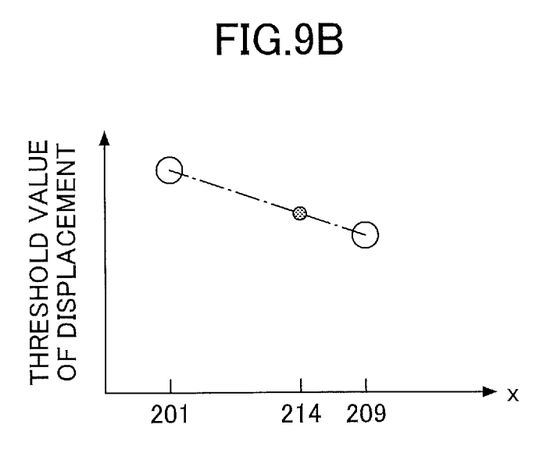
FIG. 9B is a diagram illustrating the linear interpolation in one example of the load determination method.
Figure 9C:
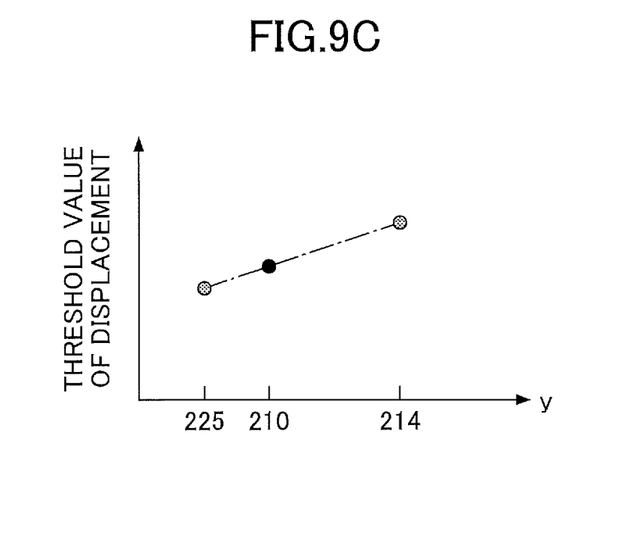
FIG. 9C is a diagram illustrating the linear interpolation in one example of the load determination method.

In addition, if a position offset from the points 201 through 209 of measurement is operated, it is possible to determine whether or not the load reached the reference value, by using the threshold value of the displacement at the points of measurement in a periphery of the position. FIG. 8 and FIG. 9A through FIG. 9C illustrate one example of a load determination method. In this example, it is assumed that a point 210 inside a rectangle formed by the points 201, 202, 204, and 205 of measurement is operated, as illustrated in FIG. 8. In this case, as illustrated in FIG. 9A, a threshold value of the displacement at a point 225, which is located between the two points 202 and 205 of measurement arranged in the X-axis direction and has the same Y coordinate as the point 210, is calculated by linear interpolation from the threshold values at the points 202 and 205 of measurement. Similarly, as illustrated in FIG. 9B, a threshold value of the displacement at a point 214, which is located between the two points 201 and 204 of measurement arranged in the X-axis direction and has the same Y coordinate as the point 210, is calculated by linear interpolation from the threshold values at the points 201 and 204 of measurement. Then, as illustrated in FIG. 9C, a threshold value at the point 210 is calculated by linear interpolation from the threshold values at the points 225 and 214. On the other hand, the displacement in the Z-axis direction at the point 210 can be calculated from the formula (7) described above. Accordingly, by comparing the threshold value and the displacement, it is possible to determine whether the load applied to the point 210 located at the position deviated from the points 201 through 209 of measurement reached the reference value.

Figure 10:
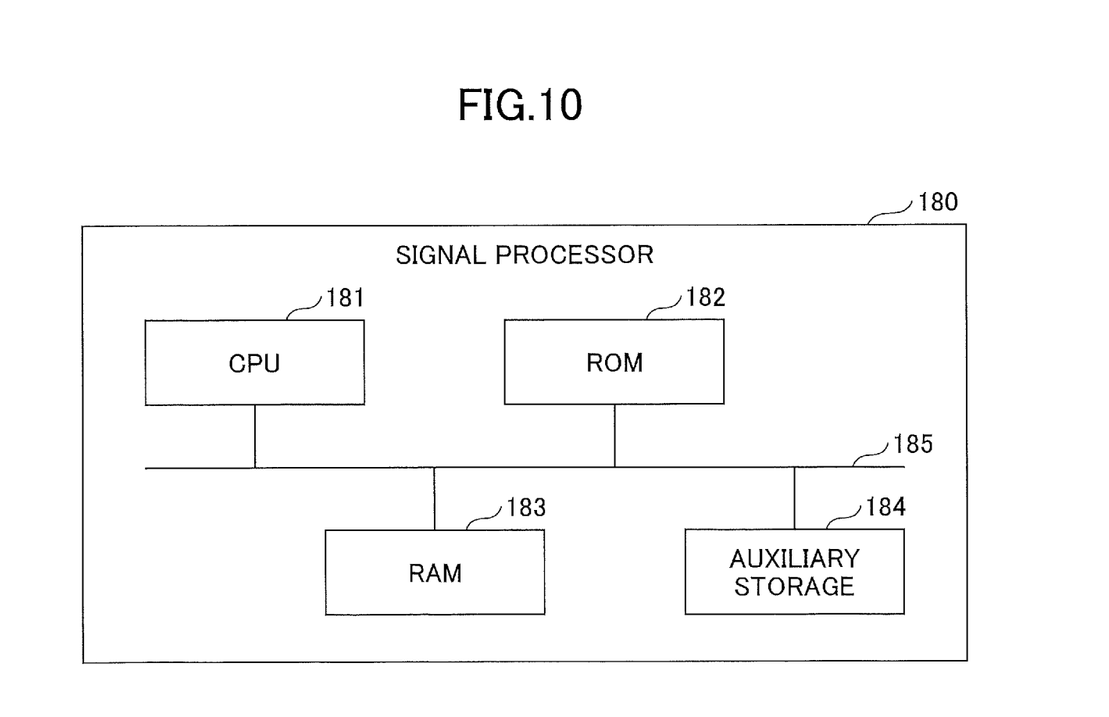
FIG. 10 is a diagram illustrating a configuration of a signal processor.

Based on the basic principle of the load detection process described above, the signal processor 180 determines whether the load applied to the operating position of the touch sensor 140 reached the reference value which causes the haptic feedback, and drives the actuator 160 according to a result of this determination to produce the haptic feedback. FIG. 10 is a diagram illustrating a configuration of the signal processor 180.

The signal processor 180 includes a Central processing Unit (CPU) 181, a Read Only Memory (ROM) 182, a Random Access Memory (RAM) 183, and an auxiliary storage 184. The CPU 181, the ROM 182, the RAM 183, and the auxiliary storage 184 form a so-called computer. Each of the parts of the signal processor 180 are connected to each other via a bus 185.

The CPU 181 executes various programs (for example, a load determination program) stored in the auxiliary storage 184.

The ROM 182 is a non-volatile main storage device. The ROM 182 stores various programs, data, or the like required by the CPU 181 in order to execute the various programs stored in the auxiliary storage 184. More particularly, the ROM 182 stores boot programs, such as a Basic Input/Output System (BIOS), Extensible Firmware Interface (EFI), or the like.

The RAM 183 is a volatile main storage device, such as a Dynamic Random Access Memory (DRAM), a Static Random Access Memory (SRAM), or the like. The RAM 183 functions as a work area that is deployed when the various programs stored in the auxiliary storage 184 are executed by the CPU 181.

The auxiliary storage 184 is an auxiliary storage device which stores the various programs executed by the CPU 181, and various data that are generated when the various programs are executed by the CPU 181.

Figure 11:
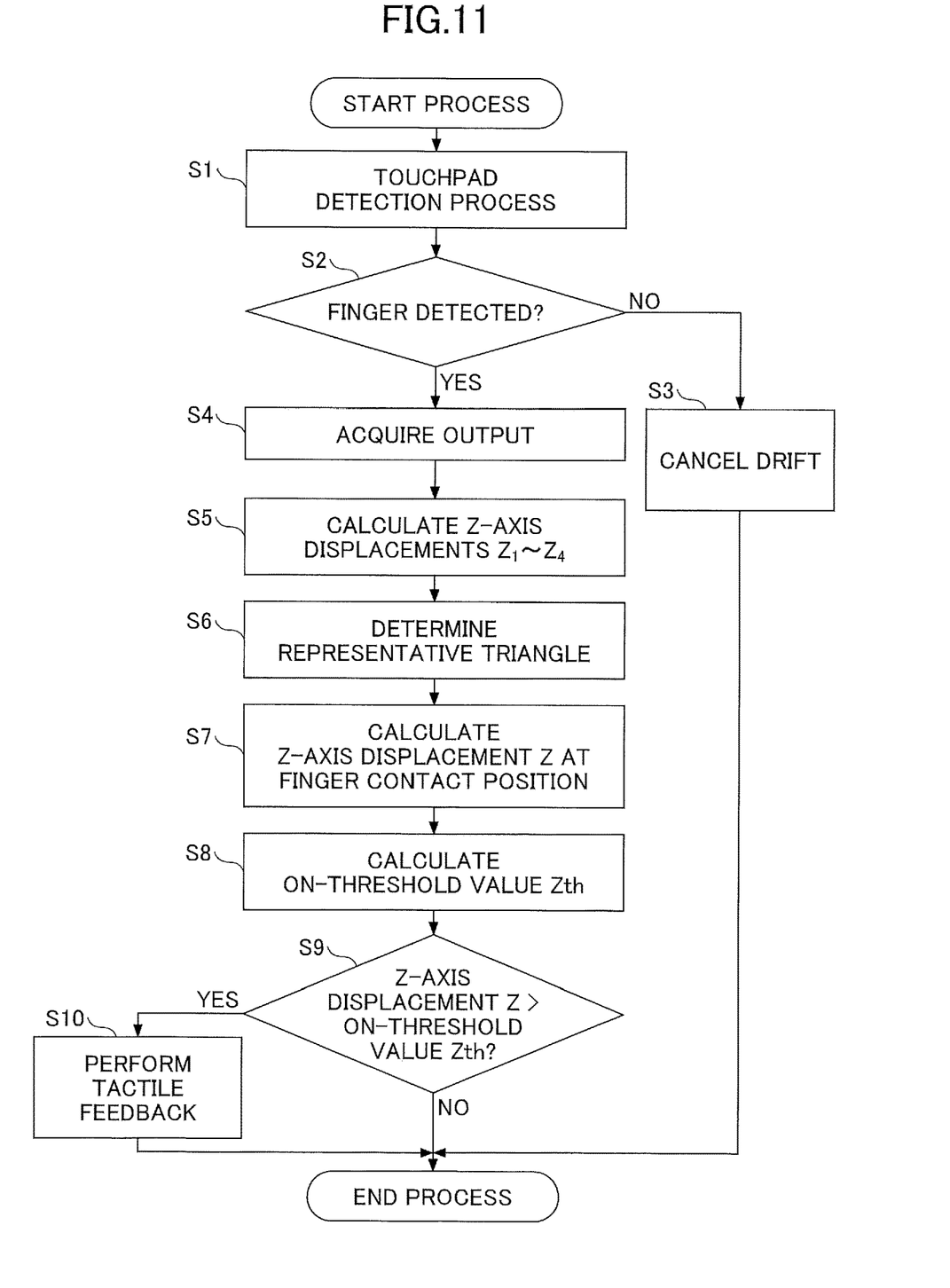
FIG. 11 is a flow chart schematically illustrating a process of the signal processor.

The signal processor 180 has such a hardware configuration, and performs the following process. FIG. 11 is a flow chart schematically illustrating the process of the signal processor 180.

First, the signal processor 180 detects a state of the touch sensor 140 (step S1). Then, the signal processor 180 determines whether or not a finger touched the touch sensor 140 (step S2), and if there is no finger touch (NO in step S2), a drift of the photo interrupters 171 through 174 is canceled (step S3).

On the other hand, if the signal processor 180 determines that the finger touched the touch sensor 140 (YES in step S2), the signal processor 180 acquires a detection signal from each of the photo interrupters 171 through 174 (step S4). For example, if the output signals of the photo interrupters 171 through 174 are analog signals, signals after being converted into digital signals are acquired.

Next, the signal processor 180 calculates displacements $Z_1$ through $Z_4$ in the Z-axis direction at detection positions on the flat plate 131, from detection signals of the photo interrupters 171 through 174, respectively (step S5).

Thereafter, the signal processor 180 determines one triangle, as a representative triangle, from among a plurality of triangles formed by three of the four photo interrupters 171 through 174 (step S6). For example, the triangle, including the operating position of the touch sensor 140 inside thereof, is preferably used as the representative triangle. In other words, in a case where the point e is touched in FIG. 6, it is preferable to use a triangle acd or a triangle acb as the representative triangle. This is because, the shorter the distance between the operating position and the photo interrupters 171 through 174, the higher the detection accuracy becomes.

Next, the signal processor 180 calculates a displacement Z in the Z-axis direction at the operating position of the touch sensor 140 (step S7). In other words, using the formula (7), the displacement Z in the Z-axis direction at the operating position is calculated from, the displacement in the Z-axis direction calculated from the detection signals of the three photo interrupters forming the representative triangle determined in step S6, and the X coordinate and the Y coordinate of the operating position detected by the touch sensor 140.

Further, the relationship between the applied load and the displacement in the Z-axis direction, such as that of the example illustrated in FIG. 7A and FIG. 7B, is determined in advance and stored in the ROM 182, and the signal processor 180 calculates a threshold value (on-threshold value) Zth in the Z-axis direction at the operating point by reading out the stored relationship (step S8).

Then, the signal processor 180 determines whether or not the displacement Z exceeds the on-threshold value Zth (step S9), and if the on-threshold value Zth is exceeded (YES in step S9), the signal processor 180 determines that the applied load exceeds the reference value, and drives the actuator 160 by a driving signal to perform the haptic feedback (step S10). For example, the signal processor 180 supplies the driving signal for vibrating the operation panel member 145 in a direction substantially parallel to a direction of the pressing operation to the actuator 160, in response to a detection of the pressing operation by the sensor (that is, the photo interrupters 171 through 174). The process ends after step S10, or if the decision result in step S9 is NO.

The input device 100 according to this embodiment performs the haptic feedback in this manner. The photo interrupters 171 through 174 can detect the Z coordinates of the points 171A through 174A on the flat plate 131 with high accuracy, and in addition, the touch sensor 140 can detect the X coordinate and the Y coordinate of the operating position with a high accuracy. Accordingly, according to the process described above, the Z coordinate of the operating position can also be detected with a high accuracy. Hence, even if the on-threshold value Zth is set to a small value on the order of approximately several tens of μm, for example, it is possible to determine, with a high accuracy, whether the haptic feedback is to be turned on or off.

According to this embodiment, because the rubber 31 is provided between the actuator 160 and the movable base 130, and the spring constant $k_s$ of the combined spring 50 is set appropriately, it is possible to reduce the inconsistencies in the feeling of the stroke when the input operation surface of the operation panel member 145 is pressed. Moreover, it is possible to appropriately transmit the vibration generated by the actuator 160 to the movable base 130.

As long as the number of elastic support members provided in the periphery of the actuator is three or more, the number is not limited to four. In other words, when viewed in the Z-axis direction (first direction), a number N of vertexes of a polygon having the elastic support members arranged at the vertexes thereof so as to surround the actuator, may be three or more, and is not limited to four. In addition, the spring constants of the N elastic support members do not necessarily have to match. For example, in the case where the input device is provided in the center console of the automobile, a number of elastic support members suited to the shape of the console may be used, and the shape and material of each elastic support member may be selected individually. If the number of elastic support members is denoted by N (where N is an integer greater than or equal to three), and the spring constant of the combined spring in which the N elastic support members are coupled in parallel is denoted by $k_N$, itis preferable that the following formula (8) stands, and more preferable that the following formula (9) stands.

$$k_N/N<=(k_1 \times k_2)/(k_1+k_2)<=k_N \tag{8}$$

$$k_N/N<=(k_1 \times k_2)/(k_1+k_2)<=k_N/2 \tag{9}$$

The actuator is not limited to the piezoelectric actuator using the electrostrictive effect, and may be a magnetic actuator using the magnetostrictive effect.

In the process described above, one representative triangle is specified, the displacement at the operating position is calculated, and the determination is made based on this displacement, however, two or more representative triangles may be specified, displacements (a first displacement, a second displacement, or the like) for each of the representative triangles may be calculated, an average value of these displacements may be obtained, and the determination may be made based on this average value. According to such a process, the determination can be made with an even higher accuracy.

Because the photo interrupters 171 through 174 do not make contact with the flat plate 131, the movement of the touch sensor 140 upon operation is not affected thereby. Non-contact type position detecting sensors, such as electrostatic sensors or the like, may be used in place of the photo interrupters 171 through 174. In addition, a contact type pressure-sensitive sensor or the like may be used as the sensor.

The input device according to the present disclosure is particularly suited for use as the input device that is provided in the center console of the automobile. The driver of the automobile can recognize the operation made by the driver, from the tactile feedback from the input device, without shifting a line of sight from a traveling direction of the automobile.

According to the present disclosure, it is possible to reduce the inconsistencies introduced in the feeling of the stroke on the input operation surface.

Although preferable embodiments or the like are described in detail above, the present disclosure is not limited to the embodiments or the like described above, and various variations, modifications, and substitutions may be made to the embodiments or the like described above without departing from the scope of the present disclosure.

What is claimed is:

1. An input device comprising:
    a base;
    an operation panel member, positioned in a first direction when viewed from the base, including an input operation surface, and configured to detect coordinates of an operating position on the input operation surface;

an actuator, fixed to the base, and configured to vibrate the operation panel member;

N elastic support members, arranged at vertex positions of a polygon shape having N corners and surrounding the actuator when viewed in the first direction, and configured to elastically support the operation panel member on the base, where N is an integer greater than or equal to three; and an elastic cushioning member provided between the actuator and the operation panel member, wherein a spring constant of a combined spring in which the actuator and the elastic cushioning member are coupled in series is determined based on spring constants of the N elastic support members.

2. The input device as claimed in claim 1, wherein a relationship $k_N/N <= k_s <= k_N$ stands, where $k_s$ denotes the spring constant of the combined spring in which the actuator and the elastic cushioning member are coupled in series, and $k_N$ denotes the spring constant of the combined spring in which the N elastic support members are coupled in parallel.

3. The input device as claimed in claim 1, wherein a relationship $k_N/N <= k_s <= k_N/2$ stands, where $k_s$ denotes the spring constant of the combined spring in which the actuator and the elastic cushioning member are coupled in series, and $k_N$ denotes the spring constant of the combined spring in which the N elastic support members are coupled in parallel.

4. The input device as claimed in claim 1, wherein the actuator is a piezoelectric actuator or a magnetic actuator.

5. The input device as claimed in claim 1, further comprising:

a sensor configured to detect a pressing operation on the operation panel member; and a controller configured to supply a driving signal for vibrating the operation panel member in a direction substantially parallel to a direction of the pressing operation to the actuator, in response to a detection of the pressing operation by the sensor.

6. The input device as claimed in claim 5, wherein the sensor includes a first sensor, a second sensor, and a third sensor, arranged on a reference plane separated from the operation panel member, and configured to detect distances to the operation panel member, respectively, wherein the controller processes signals from the operation panel member, the first sensor, the second sensor, and the third sensor, the operation panel member is tiltable with respect to the reference plane according to a load applied to the operating position, and the controller calculates displacements of the operation panel member at the operating position before and after operation of the operation panel member, from the coordinates of the operating position on the input operation surface detected by the operation panel member, and the distances detected by the first sensor, the second sensor, and the third sensor, respectively.

7. The input device as claimed in claim 6, wherein the first sensor detects, the distance to a first point on the operation panel member, the second sensor detects the distance to a second point on the operation panel member, the third sensor detects a distance to a third point on the operation panel member, and the controller specifies a plane including the first point, the second point, and the third point, and determines coordinates on the plane corresponding to the coordinates of the operating position on the input operation surface detected by the operation panel member.

8. The input device as claimed in claim 6, wherein a direction in which the first sensor, the second sensor, and the third sensor detect the distances is the first direction.

9. The input device as claimed in claim 6, wherein the operation panel member includes a touchpad, and a holding portion configured to hold the touchpad, wherein the first sensor, the second sensor, and the third sensor detect distances to the holding portion, respectively.

10. The input device as claimed in claim 6, wherein the first sensor, the second sensor, and the third sensor are photo sensors.

11. The input device as claimed in claim 5, wherein a relationship $k_N/N <= k_s <= k_N$ stands, where $k_s$ denotes the spring constant of the combined spring in which the actuator and the elastic cushioning member are coupled in series, and $k_N$ denotes the spring constant of the combined spring in which the N elastic support members are coupled in parallel.

12. The input device as claimed in claim 5, wherein a relationship $k_N/N <= k_s <= k_N/2$ stands, where $k_s$ denotes the spring constant of the combined spring in which the actuator and the elastic cushioning member are coupled in series, and $k_N$ denotes the spring constant of the combined spring in which the N elastic support members are coupled in parallel.

13. The input device as claimed in claim 1, wherein a relationship $k_N/N <= k_s$ stands, where $k_s$ denotes the spring constant of the combined spring in which the actuator and the elastic cushioning member are coupled in series, and $k_N$ denotes the spring constant of the combined spring in which the N elastic support members are coupled in parallel.

* * * * *